United States Patent [19]

Van Husen

[11] Patent Number: 4,467,399
[45] Date of Patent: Aug. 21, 1984

[54] POWER SUPPLY PACKAGING ARRANGEMENT

[75] Inventor: Hendrik W. Van Husen, Glen Ellyn, Ill.

[73] Assignee: GTE Automatic Electric Labs Inc., Northlake, Ill.

[21] Appl. No.: 332,138

[22] Filed: Dec. 18, 1981

[51] Int. Cl.³ .............................................. H05K 7/20
[52] U.S. Cl. ................................... 361/379; 361/419; 361/427; 336/59; 336/92
[58] Field of Search .............. 361/331, 332, 334, 379, 361/380, 392, 395, 399, 417, 419, 420, 427, 429, 381, 382, 383; 174/16 R; 336/59, 65, 90, 92, 105, 67

[56] References Cited

U.S. PATENT DOCUMENTS

| | | | |
|---|---|---|---|
| 1,731,894 | 10/1929 | Frisch | 336/90 |
| 2,158,868 | 5/1939 | Stacy | 174/16 R |
| 2,354,078 | 7/1944 | Vance | 336/98 |
| 2,403,072 | 7/1946 | Gates | 174/16 R |
| 2,658,101 | 11/1953 | Coxe, Jr. | 174/51 |
| 2,756,368 | 7/1956 | Gross | 174/17 R |
| 2,887,525 | 5/1959 | Lewus | 174/52 R |
| 2,935,548 | 5/1960 | Kozinski | 174/17 R |
| 3,360,752 | 12/1967 | Uptegraff, Jr. | 336/92 |
| 3,467,762 | 9/1969 | Boudouris | 174/52 R |
| 3,495,024 | 2/1970 | Bowman | 174/52 R |
| 3,587,908 | 6/1971 | Nickel | 336/65 |
| 4,222,089 | 9/1980 | MacAskill, Jr. | 361/263 |

Primary Examiner—Gerald P. Tolin
Attorney, Agent, or Firm—Gregory G. Hendricks; Robert J. Black

[57] ABSTRACT

A power supply packaging arrangement which utilizes transformer as the main structural component. Side panels of the package are connected to the transformer. These panels support the transformer, additional power supply circuitry and the top, front and rear sides of the package.

7 Claims, 4 Drawing Figures

POWER SUPPLY PACKAGING ARRANGEMENT

BACKGROUND OF THE INVENTION (1) Field of the Invention

The present invention relates to power supplies and more particularly to a packaging arrangement for support and enclosure of said power supply.

(2) Description of the Prior Art

Typical packaging arrangements include a substantial chassis suitable for supporting heavy power supply components such as a power transformer and other circuitry. A cover is then connected to this chassis to enclose the electrical components.

Various power supply packaging arrangements exist in the prior art. They are usually based on, or are modifications of, this approach. U.S. Pat. No. 2,658,101 issued to W. W. Koxe, Jr., on Nov. 3, 1953, discloses such an arrangement wherein the power supply circuitry is mounted to a chassis which is enclosed by a cover. Examples of such packaging arrangements include the following:

| U.S. Pat. No. | Date | Inventor |
| --- | --- | --- |
| 2,935,548 | 5/03/60 | J. Kozinski |
| 3,467,762 | 9/16/65 | A. Boudouris |
| 2,158,868 | 5/16/39 | J. D. Stacy |
| 2,403,072 | 7/02/46 | H. S. Gates |
| 2,756,368 | 7/24/56 | M. J. Gross, et al. |
| 3,587,908 | 6/28/71 | D. L. Nickel |

Other packaging arrangements include U.S. Pat. No. 2,887,525, issued to A. J. Lewus, on May 19, 1959, and U.S. Pat. No. 3,495,024, issued to J. Bowman on Feb. 10, 1970. Lewus discloses an enclosure arrangement with guides for attachment of light-weight sub-assemblies, while Bowman mounts sub-assemblies in a box. However none of these arrangements are capable of supporting heavy power supply components such as a power transformer, without the use of a chassis.

Accordingly, it is the object of the present invention to provide a light-weight, minimum cost, power supply packaging arrangement which does not require a chassis.

SUMMARY OF THE INVENTION

The present invention is a power supply packaging arrangement which supports heavy power supply circuitry such as a power transformer without using a chassis. The side panels of the package are connected to and support the power transformer. The remaining power supply circuitry is mounted on a circuit board which is also supported by the side panels. Finally, a U-shaped cover, which encloses the top front and rear of the power supply, is also supported by the side panels. Thus, the side panels and U-shaped cover complete the enclosure.

DESCRIPTION OF THE PREFERRED EMBODIMENT

Figure 1:
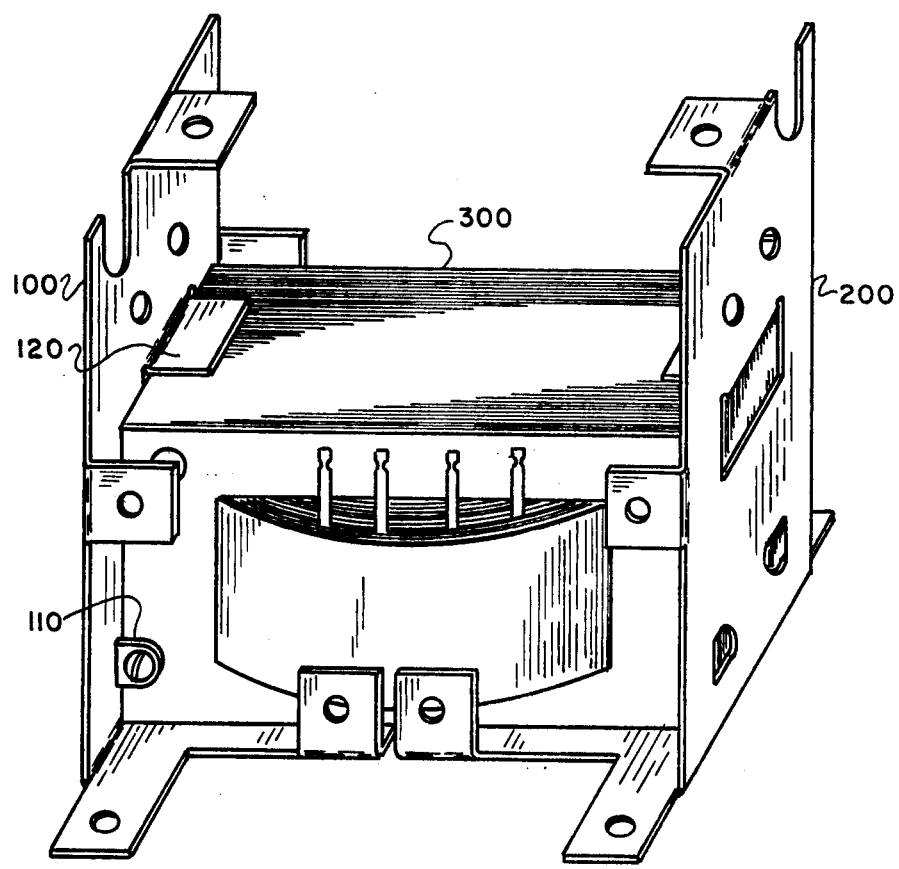
FIG. 1 is a perspective view of a transformer mounted to the side panels.

The power supply packaging arrangement of the present invention discloses a novel power supply packaging arrangement which does not require the use of a chassis for mounting heavy components such as a power transformer. This novel arrangement is based on the concept of mounting the power transformer to the side panels of the package rather than mounting it to a chassis and covering it and other power supply circuitry with a box type enclosure. Referring now to FIG. 1, the transformer is shown connected to the side panels. Identical side panels 100 and 200 connect to opposite sides of transformer 300. Tab 110 provides means of connecting transformer 300 to side panel 100 and tab 120 provides additional means for locating transformer 300 with respect to side panel 100.

Figure 2:
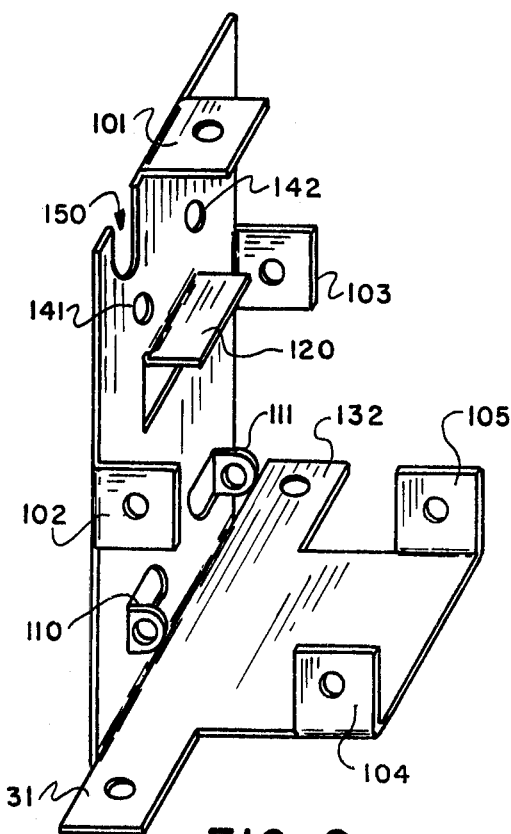
FIG. 2 is a perspective view of one of two identical side panels.

Referring now to FIG. 2, the details of side panel 100 are shown. Tabs 110 and 111 provide means for mounting side panel 100 to a transformer. Tab 120 is an antitilt tab and it provides further means of locating a transformer with respect to the side panel. Tabs 101–105 provide means for mounting a cover to a transformer when both side panels have been attached to the transformer. Tabs 131 and 132 are used for mounting the power supply package to associated equipment. Holes 141 and 142 provide means for mounting a circuit board to the side panels. With this arrangement a circuit board typically has protrusions extending from it. The circuit board is then mounted to the side panel by inserting the protrusions into holes 141 and 142. If insulation is required, insulators can be inserted in these holes before mounting the circuit board to the side panels. Slot 150 provides means for routing a cable between the power supply circuitry and an external power source. A similar slot is provided in the other panel and it provides means for routing a power output cord to the associated equipment to be powered.

Figure 3:
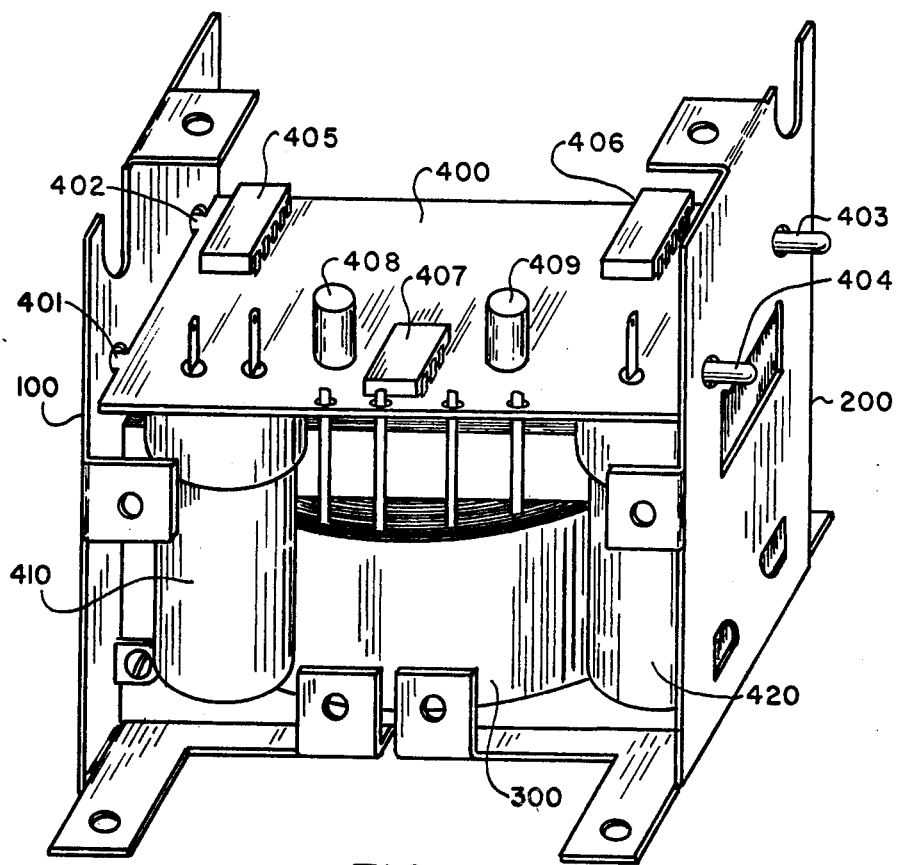
FIG. 3 is a perspective view of a circuit board mounted to the transformer connected side panels.

Referring now to FIG. 3, circuit board 400 is shown mounted to side panels 100 and 200 via insertion of protrusions 401–404 of circuit board 400 into holes 141, 142, 241 and 242 of side panels 100 and 200. Various circuit components are shown mounted on top of circuit board 400. These include bridge rectifiers 405–406, regulator 407, fuse 408 and breaker button 409. Large components such as capacitors 410 and 420 are shown mounted below circuit board 400.

Figure 4:
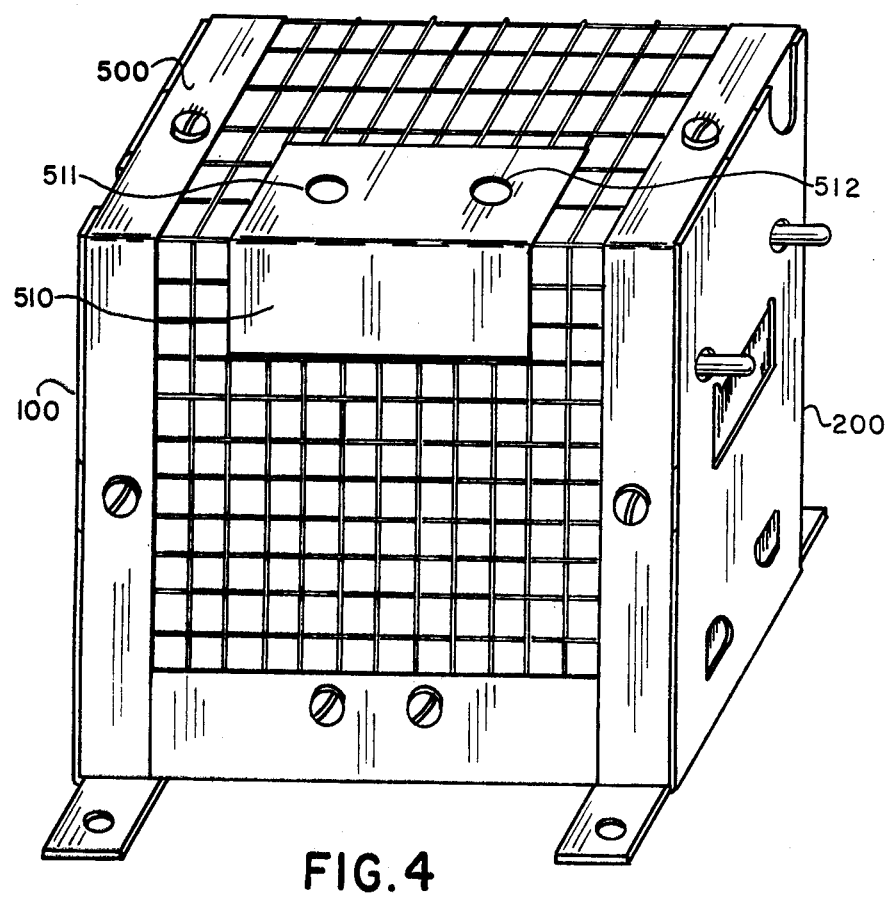
FIG. 4 is a perspective view of the completely assembled packaging arrangement showing a U-shaped cover connected to the side plates.

Referring now to FIG. 4, the assembled power supply packaging arrangement is shown with cover 500 attached to side panels 100 and 200. Cover 500 is perforated to allow for heat flow. Non-perforated area 510 covers the line voltage area of the circuit board and holes 511 and 512 allow access to the fuse and circuit breaker. Since the power transformer and circuit board are securely mounted to the side panels this power supply packing arrangement can be mounted either vertically or horizontally.

Thus the power supply packaging arrangement of the present invention discloses a novel packaging arrangement which does not require the use of a chassis for mounting heavy components such as a power transformer. The power transformer and associated circuit board are instead mounted to side panels. A perforated cover is attached to these side panels.

It will be obvious to those skilled in the art that numerous modifications of the present invention can be made without departing from the spirit of the invention which shall be limited only by the scope of the claims appended hereto.

What is claimed is:

1. A power supply packaging arrangement for use with electrical equipment, said power supply packaging arrangement comprising:

first and second side panels each including a pair of transformer connecting tabs extending perpendicular therefrom, and spaced apart and parallel to each other;

a transformer mounted between said side panels via said transformer connecting tabs, each of said pair of transformer connecting tabs being connected to opposite sides of said transformer;

a cover connected to said side panels;

each of said side panels including a lower edge and a partial bottom panel extending from said lower edge and perpendicular to said side panels, said partial bottom panels embracing said transformer;

said cover, together with said side and bottom panels substantially enclosing said transformer; and a circuit board, mounted to said first and second side panels and within the enclosure defined by said side panels and said cover;

said side panels each including a locating tab extending therefrom, whereby movement of said transformer in a plane parallel to said side panels is restricted by said partial bottom panels and said locating tabs;

said circuit board including at least one circuit board mounting tab extending from opposite edges of said circuit board, said side panels each including at least one circuit board mounting tab receptacle, whereby said circuit board is mounted to said side panels by inserting said circuit board mounting tabs into said circuit board mounting tab receptacles.

2. A power supply packaging arrangement as claimed in claim 1 wherein: said side panels are parallel to each other.

3. A power supply packaging arrangement as claimed in claim 1, wherein: said cover includes first and second sides each having an upper edge, said first and second sides connected to each other at said upper edges by a third side arranged perpendicular to said first and second sides.

4. A power supply packaging arrangement as claimed in claim 3, wherein: said first, second and third sides of said cover are perforated.

5. A power supply packaging arrangement as claimed in claim 1, wherein: said locating tabs are perpendicular to said side panels.

6. A power supply packaging arrangement as claimed in claim 1, wherein: said side panels each include at least one cover mounting tab extending from an edge of an associated side panel and arranged perpendicular to said side panel.

7. A power supply packaging arrangement as claimed in claim 1, wherein: said side panels each include an opening for electrical connection to said electrical equipment.

* * * * *